(12) United States Patent
Hornung et al.

(10) Patent No.: US 10,600,536 B1
(45) Date of Patent: Mar. 24, 2020

(54) ELECTRICAL CABLE

(71) Applicant: TE CONNECTIVITY CORPORATION, Berwyn, PA (US)

(72) Inventors: Craig Warren Hornung, Harrisburg, PA (US); Megha Shanbhag, Santa Clara, CA (US); Chad William Morgan, Carneys Point, NJ (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 16/159,003

(22) Filed: Oct. 12, 2018

(51) Int. Cl.
| H01B 11/04 | (2006.01) |
| H01B 11/10 | (2006.01) |
| H01B 7/08 | (2006.01) |
| H05K 9/00 | (2006.01) |
| H01B 7/18 | (2006.01) |
| H01B 11/00 | (2006.01) |

(52) U.S. Cl.
CPC ....... *H01B 11/1016* (2013.01); *H01B 7/0823* (2013.01); *H01B 7/18* (2013.01); *H05K 9/0088* (2013.01); *H01B 11/002* (2013.01)

(58) Field of Classification Search
CPC .............................. H01B 11/002; H01B 11/04
See application file for complete search history.

(56) References Cited

U.S. PATENT DOCUMENTS

| 3,340,353 A | 9/1967 | Mildner |
| 3,439,111 A | 4/1969 | Miracle et al. |
| 4,221,926 A | 9/1980 | Schneider |
| 4,596,897 A | 6/1986 | Gruhn |
| 4,644,092 A | 2/1987 | Gentry |
| 5,142,100 A | 8/1992 | Vaupotic |
| 5,329,064 A | 7/1994 | Tash et al. |
| 5,349,133 A | 9/1994 | Rogers |
| 5,619,016 A | 4/1997 | Newmoyer |
| 6,010,788 A | 1/2000 | Kebabjian et al. |

(Continued)

FOREIGN PATENT DOCUMENTS

| CN | 201327733 | 10/2009 |
| CN | 201359878 | 12/2009 |

(Continued)

OTHER PUBLICATIONS

Co-pending U.S. Appl. No. 15/925,243, filed Mar. 19, 2018.

(Continued)

*Primary Examiner* — Chau N Nguyen

(57) ABSTRACT

An electrical cable includes a conductor assembly having a first conductor, a second conductor, a first insulator surrounding the first conductor and a second insulator surrounding the second conductor. The first insulator has a first thickness between the first conductor and an outer surface. The second insulator has a second thickness between the second conductor and an outer surface. The first thickness is greater than the second thickness. A cable shield is wrapped around the conductor assembly and engages the outer surface of the first insulator along a first segment and engaging the outer surface of the second insulator along a second segment. The cable shield has an inner edge and a flap covering the inner edge. The cable shield forms a void at the inner edge located closer to the first conductor than the second conductor.

20 Claims, 2 Drawing Sheets

(56) References Cited

U.S. PATENT DOCUMENTS

| | | | |
|---|---|---|---|
| 6,121,335 A * | 9/2000 | Higashikubo | C08J 9/0061 521/134 |
| 6,403,887 B1 | 6/2002 | Kebabjian et al. | |
| 6,504,379 B1 | 1/2003 | Jackson | |
| 6,677,518 B2 | 1/2004 | Hirakawa et al. | |
| 7,314,998 B2 | 1/2008 | Amato et al. | |
| 7,790,981 B2 | 9/2010 | Vaupotic et al. | |
| 7,827,678 B2 | 11/2010 | Dion et al. | |
| 7,999,185 B2 | 8/2011 | Cases et al. | |
| 8,378,217 B2 | 2/2013 | Sugiyama et al. | |
| 8,381,397 B2 | 2/2013 | Dion et al. | |
| 8,440,910 B2 | 5/2013 | Nonen et al. | |
| 8,546,691 B2 | 10/2013 | Watanabe et al. | |
| 8,552,291 B2 | 10/2013 | Lingambudi et al. | |
| 8,575,488 B2 | 11/2013 | Sugiyama et al. | |
| 8,674,228 B2 | 3/2014 | Dion et al. | |
| 8,866,010 B2 | 10/2014 | Nonen et al. | |
| 8,981,216 B2 | 3/2015 | Grant et al. | |
| 8,993,883 B2 | 3/2015 | Kumakura et al. | |
| 9,064,621 B2 | 6/2015 | Kodama et al. | |
| 9,117,572 B2 | 8/2015 | Fukasaku | |
| 9,123,452 B2 | 9/2015 | Sugiyama et al. | |
| 9,123,457 B2 | 9/2015 | Kaga et al. | |
| 9,136,042 B2 | 9/2015 | Sugiyama et al. | |
| 9,142,333 B2 | 9/2015 | Kaga et al. | |
| 9,159,472 B2 | 10/2015 | Nordin et al. | |
| 9,214,260 B2 | 12/2015 | Ishikawa et al. | |
| 9,299,481 B2 | 3/2016 | Ishikawa et al. | |
| 9,349,508 B2 | 5/2016 | Nonen et al. | |
| 9,350,571 B2 | 5/2016 | Watanabe et al. | |
| 9,466,408 B2 | 10/2016 | Sugiyama | |
| 9,484,127 B2 | 11/2016 | Sugiyama et al. | |
| 9,496,071 B2 | 11/2016 | Nagagashi | |
| 9,548,143 B2 | 1/2017 | Sugiyama et al. | |
| 9,583,235 B2 | 2/2017 | Nonen et al. | |
| 9,660,318 B2 | 5/2017 | Sugiyama et al. | |
| 2003/0150633 A1 | 8/2003 | Hirakawa et al. | |
| 2006/0254801 A1 | 11/2006 | Stevens | |
| 2010/0307790 A1 | 12/2010 | Okano | |
| 2011/0100682 A1 | 5/2011 | Nonen et al. | |
| 2011/0127062 A1 | 6/2011 | Cases et al. | |
| 2012/0024566 A1 | 2/2012 | Shimosawa et al. | |
| 2012/0080211 A1 | 4/2012 | Brown et al. | |
| 2012/0152589 A1 | 6/2012 | Kumakura et al. | |
| 2012/0227998 A1 | 9/2012 | Lindstrom et al. | |
| 2013/0175081 A1 | 7/2013 | Watanabe et al. | |
| 2013/0333913 A1 | 12/2013 | Nonen et al. | |
| 2014/0048302 A1 | 2/2014 | Nonen et al. | |
| 2014/0102783 A1 | 4/2014 | Nagahashi et al. | |
| 2014/0305676 A1 | 10/2014 | Sugiyama et al. | |
| 2015/0000954 A1 | 1/2015 | Nonen et al. | |
| 2015/0255928 A1 | 9/2015 | Liptak et al. | |
| 2016/0111187 A1 | 4/2016 | Kodama | |
| 2016/0155540 A1 | 6/2016 | Matsuda et al. | |
| 2016/0300642 A1 * | 10/2016 | Kodama | H01B 3/307 |
| 2016/0343474 A1 | 11/2016 | Nichols | |
| 2016/0372235 A1 | 12/2016 | Sugiyama et al. | |
| 2017/0103830 A1 | 4/2017 | Dettmer et al. | |
| 2018/0096755 A1 | 4/2018 | Tsujino et al. | |
| 2018/0366243 A1 * | 12/2018 | Farkas | H01B 11/20 |

FOREIGN PATENT DOCUMENTS

| | | |
|---|---|---|
| CN | 102231303 | 11/2011 |
| CN | 203931605 | 11/2014 |
| CN | 105741965 | 7/2016 |
| JP | 2000040423 | 2/2000 |
| JP | 2001093357 | 4/2001 |
| JP | 2012009321 | 1/2012 |
| JP | 2012238468 | 12/2012 |
| JP | 2013038082 | 2/2013 |
| JP | 2013258009 | 12/2013 |
| JP | 2014038802 | 2/2014 |
| JP | 2014078339 | 5/2014 |
| JP | 2014099404 | 5/2014 |
| JP | 2014142247 | 8/2014 |
| JP | 2014154490 | 8/2014 |
| JP | 2014157709 | 8/2014 |
| JP | 2015076138 | 4/2015 |
| JP | 2015146298 | 8/2015 |
| JP | 2015204195 | 11/2015 |
| JP | 2015230836 | 12/2015 |
| JP | 2016015255 | 1/2016 |
| JP | 2016027547 | 2/2016 |
| JP | 2016072007 | 5/2016 |
| JP | 2016072196 | 5/2016 |
| JP | 2016110960 | 6/2016 |
| JP | 2016213111 | 12/2016 |
| WO | 96041351 | 12/1996 |

OTHER PUBLICATIONS

Co-pending U.S. Appl. No. 15/925,265, filed Mar. 19, 2018.
Co-pending U.S. Appl. No. 15/969,264, filed May 2, 2018.
Co-pending U.S. Appl. No. 15/952,690, filed Apr. 13, 2018.
Co-pending U.S. Appl. No. 16/159,053, filed Oct. 12, 2018.

* cited by examiner

ELECTRICAL CABLE

BACKGROUND OF THE INVENTION

The subject matter herein relates generally to electrical cables that provide shielding around signal conductors.

Shielded electrical cables are used in high-speed data transmission applications in which electromagnetic interference (EMI) and/or radio frequency interference (RFI) are concerns. Electrical signals routed through shielded cables may radiate less EMI/RFI emissions to the external environment than electrical signals routed through non-shielded cables. In addition, the electrical signals being transmitted through the shielded cables may be better protected against interference from environmental sources of EMI/RFI than signals through non-shielded cables.

Shielded electrical cables are typically provided with a cable shield formed by a tape wrapped around the conductor assembly. Signal conductors are typically arranged in pairs conveying differential signals. The signal conductors are surrounded by an insulator and the cable shield is wrapped around the insulator. However, where the cable shield overlaps itself, a void is created that is filled with air, which has a different dielectric constant than the material of the insulator and shifts the cable shield farther from the signal conductor. The void affects the electrical performance of the conductors in the electrical cable by changing the dielectric constant of the material near one of the conductors compared to the other of the conductors within the differential pair, leading to electrical skew.

A need remains for an electrical cable that improves signal performance.

BRIEF DESCRIPTION OF THE INVENTION

In an embodiment, an electrical cable is provided including a conductor assembly having a first conductor, a second conductor, a first insulator surrounding the first conductor and a second insulator surrounding the second conductor. The first and second conductors carry differential signals. The first insulator has an outer surface and a first effective dielectric constant. The second insulator has an outer surface and a second effective dielectric constant less than the first effective dielectric constant. The electrical cable includes a cable shield wrapped around the conductor assembly and engaging the outer surface of the first insulator along a first segment and engaging the outer surface of the second insulator along a second segment. The cable shield has an inner edge and a flap covering the inner edge forming a void at the inner edge located closer to the first conductor than the second conductor.

In another embodiment, an electrical cable is provided including a conductor assembly having a first conductor, a second conductor, a first insulator surrounding the first conductor and a second insulator surrounding the second conductor. The first and second conductors carry differential signals. The first insulator has an outer surface and the second insulator has an outer surface. The first insulator includes a homogeneous polyolefin material having a first effective dielectric constant and the second insulator includes a blended polyolefin material having a polyolefin materials and at least one other polymer material forming the blended polyolefin material. The blended polyolefin material has a second effective dielectric constant less than the first effective dielectric constant. The electrical cable includes a cable shield wrapped around the conductor assembly and engaging the outer surface of the first insulator along a first segment and engaging the outer surface of the second insulator along a second segment. The cable shield has an inner edge and a flap covering the inner edge forming a void at the inner edge located closer to the first conductor than the second conductor.

In a further embodiment, an electrical cable is provided including a conductor assembly having a first conductor, a second conductor, a first insulator surrounding the first conductor and a second insulator surrounding the second conductor. The first and second conductors carry differential signals. The first insulator has an outer surface and the second insulator has an outer surface. The second insulator has air bubbles introduced into insulator material of the second insulator to have a lower effective dielectric constant than insulator material of the first insulator. The electrical cable includes a cable shield wrapped around the conductor assembly and engaging the outer surface of the first insulator along a first segment and engaging the outer surface of the second insulator along a second segment. The cable shield has an inner edge and a flap covering the inner edge forming a void at the inner edge located closer to the first conductor than the second conductor.

BRIEF DESCRIPTION OF THE DRAWINGS

FIG. 1 is a perspective view of a portion of an electrical cable formed in accordance with an embodiment.

DETAILED DESCRIPTION OF THE INVENTION

Figure 1:
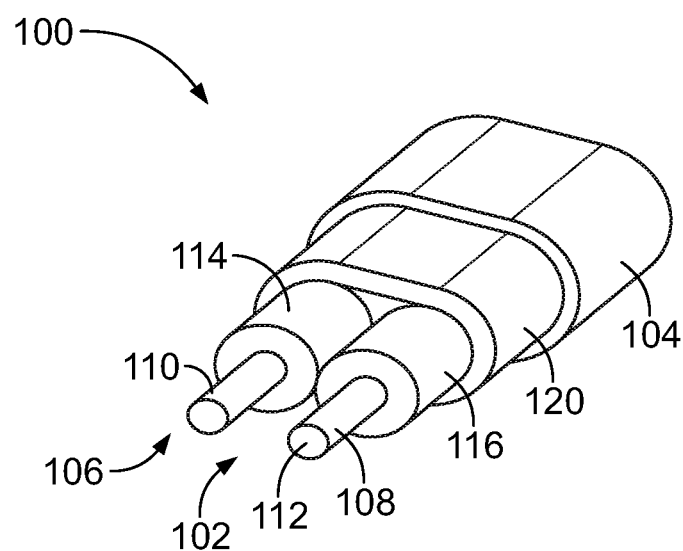
FIG. 1 is

FIG. 1 is a perspective view of a portion of an electrical cable 100 formed in accordance with an embodiment. The electrical cable 100 may be used for high speed data transmission between two electrical devices, such as electrical switches, routers, and/or host bus adapters. For example, the electrical cable 100 may be configured to transmit data signals at speeds of at least 10 gigabits per second (Gbps), which is required by numerous signaling standards, such as the enhanced small form-factor pluggable (SFP+) standard. For example, the electrical cable 100 may be used to provide a signal path between high speed connectors that transmit data signals at high speeds.

The electrical cable 100 includes a conductor assembly 102. The conductor assembly 102 is held within an outer jacket 104 of the electrical cable 100. The outer jacket 104 surrounds the conductor assembly 102 along a length of the conductor assembly 102. In FIG. 1, the conductor assembly 102 is shown protruding from the outer jacket 104 for clarity in order to illustrate the various components of the conductor assembly 102 that would otherwise be obstructed by the outer jacket 104. It is recognized, however, that the outer jacket 104 may be stripped away from the conductor assembly 102 at a distal end 106 of the cable 100, for example, to allow for the conductor assembly 102 to terminate to an electrical connector, a printed circuit board, or the like. In an alternative embodiment, the electrical cable 100 does not include the outer jacket 104.

The conductor assembly 102 includes inner conductors arranged in a pair 108 that are configured to convey data signals. In an exemplary embodiment, the pair 108 of conductors defines a differential pair conveying differential signals. The conductor assembly 102 includes a first conductor 110 and a second conductor 112. In various embodiments, the conductor assembly 102 is a twin-axial differential pair conductor assembly. In an exemplary embodiment, the conductor assembly 102 includes a first insulator 114 and a second insulator 116 surrounding the first and second conductors 110, 112, respectively. For example, the first insulator 114 may be extruded with the first conductor 110 and the second insulator 116 may be extruded with the second conductor 112. The first and second insulators 114, 116 are separate and discrete insulators sandwiched together within the cable core of the electrical cable 100. The conductor assembly 102 includes a cable shield 120 surrounding the conductor assembly 102 and providing electrical shielding for the conductors 110, 112.

The conductors 110, 112 extend longitudinally along the length of the cable 100. The conductors 110, 112 are formed of a conductive material, for example a metal material, such as copper, aluminum, silver, or the like. Each conductor 110, 112 may be a solid conductor or alternatively may be composed of a combination of multiple strands wound together. The conductors 110, 112 extend generally parallel to one another along the length of the electrical cable 100.

The first and second insulators 114, 116 surround and engage outer perimeters of the corresponding first and second conductors 110, 112. As used herein, two components "engage" or are in "engagement" when there is direct physical contact between the two components. The insulators 114, 116 are formed of a dielectric material, for example one or more plastic materials, such as a polyolefin material. The insulators 114, 116 may be formed directly to the inner conductors 110, 112 by a molding process, such as extrusion, overmolding, injection molding, or the like. The insulators 114, 116 extend between the conductors 110, 112 and the cable shield 120. The insulators 114, 116 separate or space apart the conductors 110, 112 from one another and separate or space apart the conductors 110, 112 from the cable shield 120. The insulators 114, 116 maintain separation and positioning of the conductors 110, 112 along the length of the electrical cable 100. The size and/or shape of the conductors 110, 112, the size and/or shape of the insulators 114, 116, and the relative positions of the conductors 110, 112 and the insulators 114, 116 may be modified or selected in order to attain a particular impedance for the electrical cable 100. In an exemplary embodiment, the conductors 110, 112 and the insulators 114, 116 may be symmetrical within the cable core. For example, the conductors 110, 112 may have similar diameters and the insulators 114, 116 may have similar diameters. In an exemplary embodiment, the insulators 114, 116 may be different to compensate for skew imbalance induced by the cable shield 120 on the conductors 110, 112. For example, in an exemplary embodiment, the second insulator 116 may have a lower dielectric constant than the first insulator 114 to affect capacitance of the second conductor 112, which compensates for a decrease in capacitance in the first conductor 110 due to a void near the first conductor 110 formed by wrapping the longitudinal cable shield 120 around the cable core.

The cable shield 120 engages and surrounds outer perimeters of the insulators 114, 116. In an exemplary embodiment, the cable shield 120 is wrapped around the insulators 114, 116. For example, in an exemplary embodiment, the cable shield 120 is formed as a longitudinal wrap, otherwise known as a cigarette wrap, where the seam of the wrap extends longitudinally along the electrical cable 100. The seam, and thus the void created by the seam, is in the same location along the length of the electrical cable 100. The cable shield 120 is formed, at least in part, of a conductive material. In an exemplary embodiment, the cable shield 120 is a tape configured to be wrapped around the cable core. For example, the cable shield 120 may include a multi-layer tape having a conductive layer and an insulating layer, such as a backing layer. The conductive layer and the backing layer may be secured together by adhesive. An adhesive layer may be provided along the interior of the cable shield 120 to secure the cable shield 120 to the insulators 114, 116 and/or itself. The conductive layer may be a conductive foil or another type of conductive layer. The insulating layer may be a polyethylene terephthalate (PET) film, or similar type of film. The conductive layer provides both an impedance reference layer and electrical shielding for the first and second conductors 110, 112 from external sources of EMI/RFI interference and/or to block cross-talk between other conductor assemblies 102 or electrical cables 100. In an exemplary embodiment, the electrical cable 100 includes a wrap (not shown) or another layer around the cable shield 120 that holds the cable shield 120 on the insulators 114, 116. For example, the electrical cable 100 may include a helical wrap. The wrap may be a heat shrink wrap. The wrap is located inside the outer jacket 104.

The outer jacket 104 surrounds and engages the outer perimeter of the cable shield 120. In the illustrated embodiment, the outer jacket 104 engages the cable shield 120 along substantially the entire periphery of the cable shield 120. The outer jacket 104 is formed of at least one dielectric material, such as one or more plastics (for example, vinyl, polyvinyl chloride (PVC), acrylonitrile butadiene styrene (ABS), or the like). The outer jacket 104 is non-conductive, and is used to insulate the cable shield 120 from objects outside of the electrical cable 100. The outer jacket 104 also protects the cable shield 120 and the other internal components of the electrical cable 100 from mechanical forces, contaminants, and elements (such as fluctuating temperature and humidity). Optionally, the outer jacket 104 may be extruded or otherwise molded around the cable shield 120. Alternatively, the outer jacket 104 may be wrapped around the cable shield 120 or heat shrunk around the cable shield 120.

Figure 2:
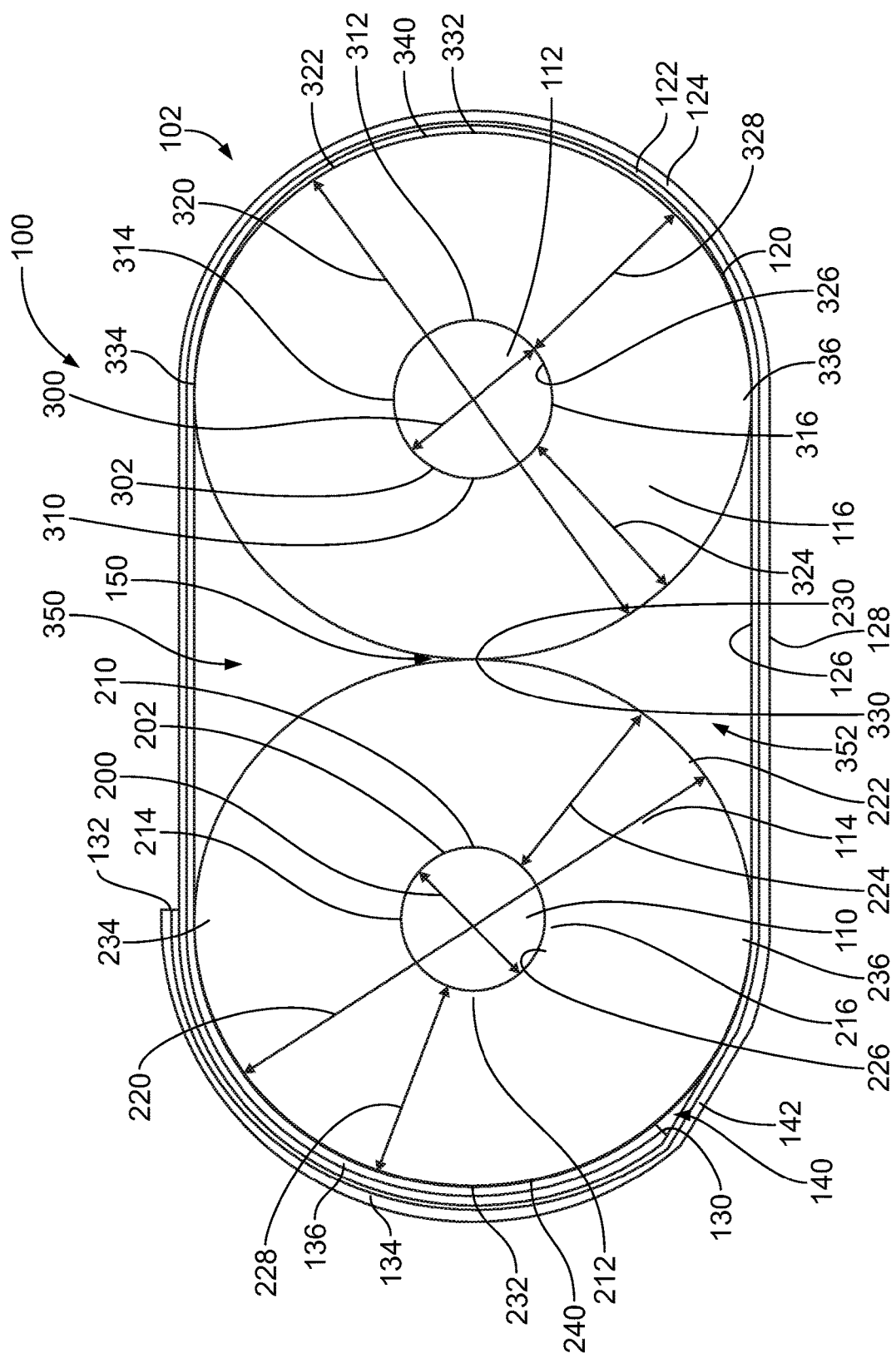
FIG. 2 is a cross-sectional view of a conductor assembly of the electrical cable in accordance with an exemplary embodiment.

FIG. 2 is a cross-sectional view of the conductor assembly 102 in accordance with an exemplary embodiment. The cable shield 120 is wrapped around the first and second insulators 114, 116 in the cable core. The cable shield 120 includes a conductive layer 122 and an insulating layer 124. In the illustrated embodiment, the conductive layer 122 is provided on an interior 126 of the cable shield 120 and insulating layer 124 the is provided on an exterior 128 of the cable shield 120; however, the conductive layer 122 may be provided on the exterior of the cable shield 120 in alternative embodiments.

The cable shield 120 includes an inner edge 130 and an outer edge 132. When the cable shield 120 is wrapped around the cable core, a flap 134 of the cable shield 120 overlaps the inner edge 130 and a segment 136 of the cable shield 120 on a seam side of the electrical cable 100. The overlapping portion of the cable shield 120 forms a seam along the seam side of the electrical cable 100. The interior 126 of the flap 134 may be secured to the exterior 128 of the segment 136 at the seam, such as using adhesive. The interior 126 of portions of the cable shield 120 may be secured directly to the first and second insulators 114, 116, such as using adhesive. In addition, or in lieu of adhesive, the cable shield 120 may be held in place around the cable core by an additional helical wrap, such as a heat shrink wrap. When the cable shield 120 is wrapped over itself to form the flap 134, a void 140 is created at the seam side of the electrical cable 100. In various embodiments, the void 140 is a pocket of air defined between the interior 126 of an elevated segment 142 of the cable shield 120 and the first insulator 114. The void 140 may be referred to hereinafter as an air void 140. However, in other various embodiments, the void 140 may be filled with another material, such as adhesive or other dielectric material. The elevated segment 142 is elevated or lifted off of the first insulator 114 to allow the flap 134 to clear the inner edge 130. The elevated segment 142 moves the cable shield 120 farther from the first conductor 110, which affects the inductance and capacitance of the first conductor 110. The volume of the air (or other dielectric material) in the void 140 affects the electrical characteristics of the nearest conductor, such as the first conductor 110, by changing the effective dielectric constant of the dielectric material between the first conductor 110 and the conductive layer 122 of the cable shield 120. The air in the void 140 and/or moving the elevated segment 142 farther from the first conductor 110 decreases the capacitance to ground of the first conductor 110, which speeds up the signals in the first conductor 110, leading to a skew imbalance for the electrical cable 100 compared to the second conductor 112. In an exemplary embodiment, the second insulator 116 has a lower dielectric constant than the first insulator 114 to proportionally decrease the capacitance of the second conductor 112 to provide zero or near-zero skew imbalance. While it may be desirable to reduce the volume of the void 140, the presence of the void 140 is inevitable when the electrical cable 100 is assembled due to the flap 134 overlapping the segment 136.

The air in the void 140 leads to a skew imbalance for the first conductor 110 by changing the effective dielectric constant of the dielectric material around the first conductor 110, compared to the second conductor 112. For example, signals transmitted by the first conductor 110 may be transmitted faster than the signals transmitted by the second conductor 112, leading to skew in the differential pair, without compensation in the second insulator 116. Signal delay in the conductor is a function of inductance and capacitance of the conductor. Delay is the square root of inductance times capacitance. The speed of the signal in the conductor is the inverse of the delay, and is thus also a function of inductance and capacitance. Capacitance of the first conductor 110 is lowered by the void 140 due to its change on the effective dielectric constant. Capacitance of the first conductor 110 is lowered because the cable shield 120 along the void 140 (for example, the flap 134) is shifted farther away from the first conductor 110 along the void 140.

In various embodiments, decrease in capacitance of the first conductor 110, due to the void 140, is compensated with a proportional decrease in capacitance of the second conductor 112 due to selection of the dielectric material of the second insulator 116 to lower the effective dielectric constant of the second insulator 116 to keep the delay or speeds in the first and second conductors 110, 112 similar, and thus mitigate skew imbalance. In an exemplary embodiment, the capacitance of the second conductor 112 is decreased by selecting insulator material for the second insulator 116 that is different than the insulator material for the first insulator 114, where the insulator material of the second insulator 116 has an effective dielectric constant that is less than the effective dielectric constant of the insulator material of the first insulator 114. For example, the first insulator 114 may be manufactured from one or more polyolefin materials and the second insulator 116 may be manufactured from one or more polyolefin materials having a lower effective dielectric constant than the insulator material of the first insulator 114.

In an exemplary embodiment, the first and second insulators 114, 116 are manufactured from polymer materials, such as polyolefin materials, fluoropolymer materials, and the like. In various embodiments, the first insulator 114 is manufactured from a homogeneous polyolefin material having a first effective dielectric constant. The second insulator 116 is manufactured from a blended polyolefin material having a polyolefin material and at least one other polymer material, which may be a second polyolefin material, forming a blended polyolefin material having a second effective dielectric constant that is lower than the first effective dielectric constant. For example, in various embodiments, the first insulator 114 is manufactured from polyethylene and the second insulator 116 is manufactured from a blended polyolefin material including a first polyolefin material, such as polyethylene, and a second polymer material, such as polypropylene. The second polyolefin material has a lower dielectric constant than the polyolefin material of the first insulator 114 to lower the effective dielectric constant of the second insulator 116 relative to the first insulator 114. The polymer materials may be a medium density polyethylene (MDPE) material, a low density polyethylene (LDPE) material, a linear low density polyethylene (LLDP) material, and the like. In other various embodiments, the second insulator may include polyphenylene oxide. In other various embodiments, the polymer material may be a fluoropolymer, such as a polytetrafluoroethylene polymer, a perfluoroalkoxy polymer, a fluorinated ethylene propylene material, and the like. The polymer material may be an expanded polytetrafluoroethylene material in various embodiments.

In other various embodiments, both the insulators 114, 116 may be manufactured from blended materials, where the first blended material of the first insulator 114 has the first effective dielectric constant and the second blended material of the second insulator 116 has the second effective dielectric constant less than the first effective dielectric constant. The blended materials may include polyolefin materials blended with non-polyolefin materials. In other various embodiments, both the insulators 114, 116 may be manufactured from homogeneous polyolefin materials, where the first homogeneous polyolefin material of the first insulator 114 has the first effective dielectric constant and the second homogeneous polyolefin material of the second insulator 116 has the second effective dielectric constant. In alternative embodiments, the insulator materials for the insulators 114, 116 may be other types of materials other than polyolefin materials where the effective dielectric constants of the insulator materials are different the balance skew effects induced by the air void 140. In various embodiments, the first insulator 114 may be manufactured from an insulator material having a first effective dielectric constant being greater than 2.3 and the second insulator 116 may be manufactured from an insulator material having a second effective dielectric constant beam 2.3 or less.

In other various embodiments, the effective dielectric constant of the second insulator 116 may be lowered by introducing gas into the material of the second insulator 116 rather than manufacturing the second insulator 116 from a different material. For example, gas bubbles such as air bubbles may be introduced into the second insulator 116 to lower the effective dielectric constant of the second insulator 116. In various embodiments, the gas bubbles may be $CO_2$ bubbles, nitrogen bubbles, and the like. In various embodiments, gas may be introduced during extrusion of the second insulator 116. For example, the second insulator 116 may be manufactured by a foaming extrusion process that introduces gas into the second insulator 116. In various embodiments, the first insulator 114 is not foamed. In other various embodiments, the first insulator 114 and the second insulator 116 are both foamed, but the second insulator 116 is foamed to introduce a greater amount of air bubbles into the second insulator 116 than the first insulator 114. The volume of gas introduced into the second insulator 116 may correspond to the volume of the air void 140 balance the skew effects from the air void 140. In an exemplary embodiment, because only the outer half of the second conductor 112 faces the cable shield (while the other half of the second conductor 112 faces the first conductor 110), the volume of air per unit length of the electrical cable 100 introduced into the insulator material of the second insulator 116 is approximately twice a volume of air of the air void 140 because only half the volume of gas introduced into the insulator material the second insulator 116 a fax the effective dielectric constant of the second insulator 116.

The first and second insulators 114, 116 are separate insulators engaging and fully surrounding the first and second conductors 110, 112, respectively. The first insulator 114 may be molded, extruded or otherwise formed with the first conductor 110 and the second insulator 116 may be molded, extruded or otherwise formed with the second conductor 112 separately from the first insulator 114 and the first conductor 110. The first and second insulators 114, 116 engage one another along a seam 150 that is located between the conductors 110, 112. In an example, the conductor assembly 102 shown in FIG. 2 may be formed by initially applying the first and second insulators 114, 116 to the respective first and second conductors 110, 112, independently, to form two insulated wires. The insulators 114, 116 of the two insulated wires are then pressed into contact with one another, and optionally bonded to one another, at the seam 150, and subsequently collectively surrounded by the cable shield 120. In various embodiments, the outer perimeters of the insulators 114, 116 are identical. For example, the first and second insulators 114, 116 have equal diameters. However, in alternative embodiments, the insulators 114, 116 may be asymmetrical, such as having different diameters. The outer perimeters of the insulators 114, 116 may have a generally lemniscate or figure-eight shape, due to the combination of the two circular or elliptical insulators 114, 116.

In an exemplary embodiment, the first conductor 110 has a first conductor outer surface 202 having a circular cross-section having a first diameter 200. The first conductor 110 has an inner end 210 facing the second conductor 112 and an outer end 212 opposite the inner end 210. The first conductor 110 has a first side 214 (for example, a top side) and a second side 216 (for example, a bottom side) opposite the first side 214. The first and second sides 214, 216 are equidistant from the inner and outer ends 210, 212.

In an exemplary embodiment, the first insulator 114 has a circular cross-section surrounding the first conductor 110. The first insulator 114 has a first diameter 220 at a first insulator outer surface 222. The first insulator 114 has a first thickness 224 between the first conductor 110 and the first insulator outer surface 222. The first thickness 224 defines a first distance or shield distance 228 between the first conductor 110 and the cable shield 120. The first insulator outer surface 222 engages the second insulator 116 at the seam 150. The first insulator 114 has an inner end 230 facing the second insulator 116 and an outer end 232 opposite the inner end 230. The first insulator 114 has a first side 234 (for example, a top side) and a second side 236 (for example, a bottom side) opposite the first side 234. The first and second sides 234, 236 are equidistant from the inner and outer ends 230, 232. The first insulator 114 may have other shapes in alternative embodiments, such as an oval shape where the shield distance 228 is variable.

The cable shield 120 engages the first insulator outer surface 222 along a first segment 240. For example, the first segment 240 may extend from approximately the first side 234 to approximately the second side 236 while passing the outer end 232. The first segment 240 may encompass approximately half of the outer circumference of the first insulator outer surface 222. The shield distance 228 between the cable shield 120 and the first conductor 110 is defined by the thickness 224 of the first insulator 114 between the inner surface 226 and the outer surface 222. The shield distance 228 affects the electrical characteristics of the signals transmitted by the first conductor 110. For example, the shield distance 228 affects the inductance and the capacitance of the first conductor 110, which affects the delay or skew of the signal, the insertion loss of the signal, the return loss of the signal, and the like. In an exemplary embodiment, the shield distance 228 may be controlled or selected, such as by selecting the diameter 200 of the first conductor 110 and selecting the diameter 220 of the first insulator 114.

In the illustrated embodiment, the void 140 is positioned along the first segment 240, such as at a section between the second side 236 and the outer end 232. The elevated segment 142 is thus defined along the first segment 240. The cable shield 120 engages the first insulator outer surface 222 on both sides of the elevated segment 142. The flap 134 wraps around a portion of the first insulator 114, such as from the elevated segment 142 to the outer edge 132. Optionally, the outer edge 132 may be located along the first segment 240, such as approximately aligned with the first side 234. The flap 134 provides electrical shielding at the inner edge 130.

The void 140 affects the electrical characteristics of the signals transmitted by the first conductor 110. For example, the void 140 decreases capacitance of the first conductor 110 by introducing air in the shield space, which has a lower dielectric constant than the dielectric material of the first insulator 114. The decrease in capacitance affects the delay (reduces delay), and thus the speed (increases speed) of the signals transmitted by the first conductor 110, which has a skew effect on the signals transmitted by the first conductor 110, relative to the signals transmitted by the second conductor 112. For example, the skew may be affected by having the signals travel faster in the first conductor 110 compared to a hypothetical situation in which no void 140 were present. Thus, the void 140 leads to skew problems in the conductor assembly 102.

In an exemplary embodiment, the second conductor 112 has a second conductor outer surface 302 having a circular cross-section having a second diameter 300. In various embodiments, the first and second conductors 110, 112 are the same gauge conductors 110, 112 such that the second diameter 300 is equal to the first diameter 200. The second conductor 112 has an inner end 310 facing the inner end 210 of the first conductor 110 and an outer end 312 opposite the inner end 310. The second conductor 112 has a first side 314 (for example, a top side) and a second side 316 (for example, a bottom side) opposite the first side 314. The first and second sides 314, 316 are equidistant from the inner and outer ends 310, 312.

In an exemplary embodiment, the second insulator 116 has a circular cross-section surrounding the second conductor 112. The second insulator 116 has a second diameter 320 at a second insulator outer surface 322. The second insulator 116 has a second thickness 324 between the second conductor 112 and the second insulator outer surface 322. The thickness 324 defines a second distance or shield distance 328 between the second conductor 112 and the cable shield 120. The second insulator outer surface 322 engages the first insulator 114 at the seam 150. The second insulator 116 has an inner end 330 facing the first insulator 114 and an outer end 332 opposite the inner end 330. The second insulator 116 has a first side 334 (for example, a top side) and a second side 336 (for example, a bottom side) opposite the first side 334. The first and second sides 334, 336 are equidistant from the inner and outer ends 330, 332.

The cable shield 120 engages the second insulator outer surface 322 along a second segment 340. For example, the second segment 340 may extend from approximately the first side 334 to approximately the second side 336 while passing the outer end 332. The second segment 340 may encompass approximately half of the outer circumference of the second insulator outer surface 322. In an exemplary embodiment, the first and second insulators 114, 116 are lemniscate and thus define a first pocket 350 and a second pocket 352 within the cable core inside of the interior 126 of the cable shield 120. In an exemplary embodiment, the first and second pockets 350, 352 are generally symmetrical, and thus do not have an appreciable affect on skew imbalance for the first or second conductors 110, 112. The conductors 110, 112 are more closely coupled to the cable shield 120 along the first and second segments 240, 340, respectively. Thus, the portion of the cable shield 120 beyond the first and second insulator outer surfaces 222, 322 across the pockets 350, 352 does not affect skew, but rather the interaction between the conductors 110, 112 and the cable shield 120 along the first and second segments 240, 340 control the skew performance.

The shield distance 328 affects the electrical characteristics of the signals transmitted by the second conductor 112. For example, the shield distance 328 affects the inductance and the capacitance of the second conductor 112, which affects the delay or skew of the signal, the insertion loss of the signal, the return loss of the signal, and the like. In an exemplary embodiment, the shield distance 328 may be controlled or selected, such as by selecting the diameter 300 of the second conductor 112 and selecting the diameter 320 of the second insulator 116.

In the illustrated embodiment, the second segment 340 does not include any void like the void 140. The second conductor 112 is thus not subjected to the same delay change as the first conductor 110 from the void 140. When comparing the first and second conductors 110, 112, the void 140 creates a skew imbalance between the first and second conductors 110, 112 by decreasing capacitance of the first conductor 110 as compared to the second conductor 112, which affects the velocity or speed of the signal transmission through the first conductor 110 as compared to the second conductor 112. However, in an exemplary embodiment, the second insulator 116 is modified compared to the first insulator 114 to compensate for the void 140. In an exemplary embodiment, the second insulator 116 has a second effective dielectric constant that is less than the first effective dielectric constant of the first insulator 114 to balance skew effects of the air void 140 on the first conductor 110 compared to the second conductor 112.

In an exemplary embodiment, a difference between the first effective dielectric constant and the second effective dielectric constant is selected to balance skew effects of the void 140 on the first conductor 110 compared to the second conductor 112 along a length of the electrical cable 100. The second effective dielectric constant is selected based on a size of the void 140 and the volume of air introduced in the void along the first conductor 110 compared to the second conductor 112 along a length of the electrical cable 100. The void 140 has a volume filled with air creating a decrease in capacitance of the first conductor 110 compared to the second conductor 112. The difference in the effective dielectric constants between the first effective dielectric constant and the second effective dielectric constant creates a decrease in capacitance of the second conductor 112 approximately equal to the decrease in capacitance of the first conductor 110 due to the air void 140 to balance skew effects on the first conductor 110 and the second conductor 112.

In an exemplary embodiment, the void 140 is filled with dielectric, such as air, but may be filled with other dielectric material. The conductor assembly 102 includes a first shield space between the first conductor outer surface 202 of the first conductor 110 and the cable shield 120. The first shield space is defined by the space along the arc between the first side 214 of the first conductor 110 and the first side 234 of the first insulator 114 and between the second side 216 of the first conductor 110 and the second side 236 of the first insulator 114 including the space between the outer end 212 of the first conductor 110 and the outer end 232 of the first insulator 114. The first shield space is defined by the interior surface of the cable shield 120, and thus includes the void 140. The first insulator 114 defines a portion (vast majority) of the first shield space. The air void 140 defines a portion (small minority) of the first shield space. The conductor assembly 102 includes a second shield space between the second conductor outer surface 302 of the second conductor 112 and the cable shield 120. The second shield space is defined by the space along the arc between the first side 314 of the second conductor 112 and the first side 334 of the second insulator 116 and between the second side 316 of the second conductor 112 and the second side 336 of the second insulator 116 including the space between the outer end 312 of the second conductor 112 and the outer end 332 of the second insulator 116. The second shield space is defined by the interior surface of the cable shield 120 and does not include any air void like the first shield space. The second insulator 116 defining a portion (vast majority) of the second shield space. The second insulator 116 may define the entirety of the second shield space in various embodiments.

In an exemplary embodiment, the first shield space has a first effective shield space dielectric constant defined by the first effective dielectric constant of the first insulator 114 and a void effective dielectric constant of the dielectric (for example, air) filling the void 140. The second shield space has a second effective shield space dielectric constant defined by the second effective dielectric constant of the second insulator 116. The first effective shield space dielectric constant (for example, combination of the dielectric constant of the insulator material of the first insulator 114 and the dielectric constant of the air) being equal to the second effective shield space dielectric constant (for example, the dielectric constant of the insulator material of the second insulator 116). Because the second effective dielectric constant of the second insulator 116 is less than the first effective dielectric constant of the first insulator 114, the effective shield space dielectric constants may be equal. For example, the second effective dielectric constant may be lower than the first effective dielectric constant by an amount corresponding to the effect of the dielectric constant of the air in the void 140. In an example, the first effective dielectric constant may be 2.31 and the effect of the void effective dielectric constant of the air in the void may lower the first effective shield space dielectric constant to a value of 2.30 or 2.29. The materials selected for the insulator material of the second insulator 116 may have a lower dielectric constant than the insulator material selected for the first insulator 114, such as a material having an effective dielectric constant of 2.30 or 2.29 to correspond to the first effective shield space dielectric constant. As such, the speeds of the signals and both the first conductor 110 and the second conductor 112 may be increased by an equivalent speed to lead to zero skew or near-zero skew.

Figure 3:
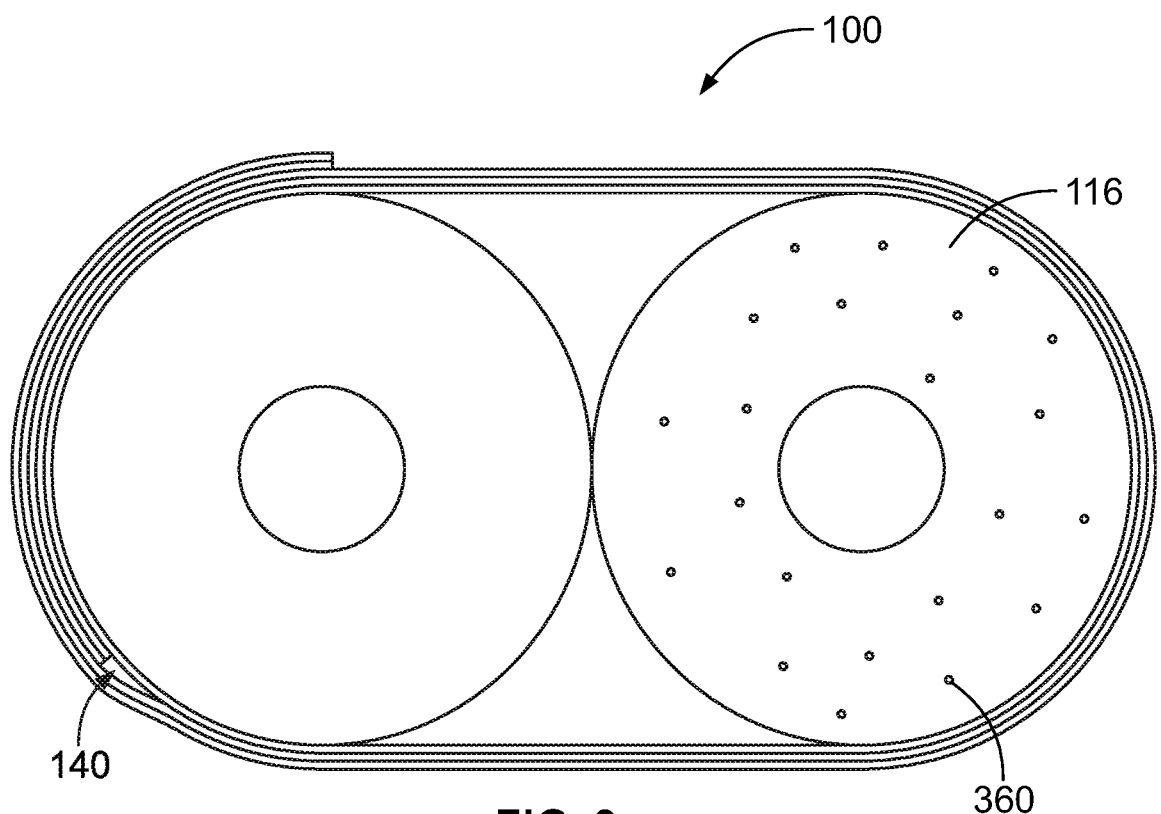
FIG. 3 is a cross-sectional view of the electrical cable in accordance with an exemplary embodiment.

FIG. 3 is a cross-sectional view of the electrical cable 100 in accordance with an exemplary embodiment. FIG. 3 illustrates the second insulator 116 having gas 360, such as air bubbles introduced into the insulator material of the second insulator 116. air bubbles may be introduced into the second insulator 116 to lower the effective dielectric constant of the second insulator 116. In various embodiments, air bubbles may be introduced during extrusion of the second insulator 116. For example, the second insulator 116 may be manufactured by a foaming extrusion process that introduces air bubbles into the second insulator 116. The volume of air introduced into the second insulator 116 may correspond to the volume of the air void 140 balance the skew effects from the air void 140.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. An electrical cable comprising:
   a conductor assembly having a first conductor, a second conductor, a first insulator surrounding the first conductor and a second insulator surrounding the second conductor, the first and second conductors carrying differential signals, the first insulator having an outer surface, the first insulator having a first effective dielectric constant, the second insulator having an outer surface, the second insulator having a second effective dielectric constant, the second effective dielectric constant being less than the first effective dielectric constant; and
   a cable shield wrapped around the conductor assembly and engaging the outer surface of the first insulator along a first segment and engaging the outer surface of the second insulator along a second segment, the cable shield having an inner edge and a flap covering the inner edge, the cable shield forming a void at the inner edge, the void being located closer to the first conductor than the second conductor;
   wherein a difference between the first effective dielectric constant and the second effective dielectric constant is selected to balance skew effects of the void on the first conductor compared to the second conductor along a length of the electrical cable.

2. The electrical cable of claim 1, wherein the second effective dielectric constant is selected based on a size of the void and the volume of air introduced in the void along the first conductor compared to the second conductor along a length of the electrical cable.

3. The electrical cable of claim 1, wherein the void is filled with dielectric, the conductor assembly including a first shield space between an outer surface of the first conductor and the cable shield and a second shield space between an outer surface of the second conductor and the cable shield, the void defining a portion of the first shield space, the first insulator defining a portion of the first shield space, the second insulator defining a portion of the second shield space, the first shield space having a first effective shield space dielectric constant defined by the first effective dielectric constant of the first insulator and a void effective dielectric constant of the dielectric filling the void, the second shield space having a second effective shield space dielectric constant defined by the second effective dielectric constant of the second insulator, the first effective shield space dielectric constant being equal to the second effective shield space dielectric constant.

4. The electrical cable of claim 1, wherein the void has a volume filled with air creating a decrease in capacitance of the first conductor compared to the second conductor, the difference in the effective dielectric constants between the first effective dielectric constant and the second effective dielectric constant creates a decrease in capacitance of the second conductor approximately equal to the decrease in capacitance of the first conductor to balance skew effects on the first conductor and the second conductor.

5. The electrical cable of claim 1, wherein the first effective dielectric constant is greater than 2.3 and the second effective dielectric constant is 2.3 or less.

6. The electrical cable of claim 1, wherein the first insulator comprises a homogeneous polyolefin material having the first effective dielectric constant, the second insulator comprising a blended material having at least two different polymer materials forming the blended material, the blended material having the second effective dielectric constant.

7. The electrical cable of claim 6, wherein the homogeneous polyolefin material comprises polyethylene and the blended material comprises polyethylene and a second polymer material having a dielectric constant lower than a dielectric constant of polyethylene.

8. The electrical cable of claim 7, wherein the second polymer material of the blended material comprises at least one of polytetrafluoroethylene, polypropylene, and polyphenylene oxide.

9. The electrical cable of claim 1, wherein the first insulator comprises a blended polyolefin material having at least two different polyolefin materials forming a first blended polyolefin material having the first effective dielectric constant, the second insulator comprising a blended polyolefin material having at least two different polyolefin materials forming the blended polyolefin material, the blended polyolefin material having the second effective dielectric constant.

10. The electrical cable of claim 1, wherein the second insulator include air bubbles introduced into insulator material of the second insulator to have a lower effective dielectric constant than insulator material of the first insulator.

11. The electrical cable of claim 1, wherein the second insulator includes a volume of air introduced into insulator material of the second insulator to lower the second effective dielectric constant compared to the first effective dielectric constant.

12. The electrical cable of claim 11, wherein the volume of air introduced into the insulator material of the second insulator is approximately twice a volume of air in the void.

13. The electrical cable of claim 1, wherein the first insulator is extruded with the first conductor and the second insulator is extruded with the second conductor, the second insulator having air bubbles introduced into insulator material of the second insulator during extrusion to introduce air into the insulator material of the second insulator.

14. An electrical cable comprising:
a conductor assembly having a first conductor, a second conductor, a first insulator surrounding the first conductor and a second insulator surrounding the second conductor, the first and second conductors carrying differential signals, the first insulator having an outer surface, the first insulator comprising a homogeneous polyolefin material having a first effective dielectric constant, the second insulator having an outer surface, the second insulator comprising a blended polyolefin material having a polyolefin material blended with at least one other polymer material forming the blended polyolefin material, the blended polyolefin material having a second effective dielectric constant, the second effective dielectric constant being less than the first effective dielectric constant; and
a cable shield wrapped around the conductor assembly and engaging the outer surface of the first insulator along a first segment and engaging the outer surface of the second insulator along a second segment, the cable shield having an inner edge and a flap covering the inner edge, the cable shield forming a void at the inner edge, the void being filled with dielectric, the void being located closer to the first conductor than the second conductor;
wherein the conductor assembly including a first shield space between an outer surface of the first conductor and the cable shield and a second shield space between an outer surface of the second conductor and the cable shield, the void defining a portion of the first shield space, the first insulator defining a portion of the first shield space, the second insulator defining a portion of the second shield space, the first shield space having a first effective shield space dielectric constant defined by the first effective dielectric constant of the first insulator and a void effective dielectric constant of the dielectric filling the void, the second shield space having a second effective shield space dielectric constant defined by the second effective dielectric constant of the second insulator, the first effective shield space dielectric constant being equal to the second effective shield space dielectric constant.

15. The electrical cable of claim 14, wherein the homogeneous polyolefin material comprises polyethylene and the blended polyolefin material comprises polyethylene and a second polyolefin material having a dielectric constant lower than a dielectric constant of polyethylene.

16. The electrical cable of claim 14, wherein the polymer material of the blended polyolefin material comprises at least one of polytetrafluoroethylene, polypropylene, and polyphenylene oxide.

17. The electrical cable of claim 14, wherein a difference between the first effective dielectric constant and the second effective dielectric constant is selected to balance skew effects of the void on the first conductor compared to the second conductor along a length of the electrical cable.

18. An electrical cable comprising:
a conductor assembly having a first conductor, a second conductor, a first insulator surrounding the first conductor and a second insulator surrounding the second conductor, the first and second conductors carrying differential signals, the first insulator having an outer surface, the second insulator having an outer surface, the second insulator having air bubbles introduced into insulator material of the second insulator to have a lower effective dielectric constant than insulator material of the first insulator; and
a cable shield wrapped around the conductor assembly and engaging the outer surface of the first insulator along a first segment and engaging the outer surface of the second insulator along a second segment, the cable shield having an inner edge and a flap covering the inner edge, the cable shield forming a void at the inner edge, the void being located closer to the first conductor than the second conductor;
wherein a volume of the air bubbles is selected based on a size of the void and the a volume of air introduced in the void along the first conductor compared to the second conductor along a length of the electrical cable.

19. The electrical cable of claim 18, wherein the volume of the air bubbles introduced into the insulator material of the second insulator is approximately twice the volume of air in the void.

20. The electrical cable of claim 18, wherein the first insulator is extruded with the first conductor and the second insulator is extruded with the second conductor, the second insulator having the air bubbles introduced into the insulator material of the second insulator during extrusion to introduce air into the insulator material of the second insulator.

* * * * *